(12) United States Patent
Chen et al.

(10) Patent No.: US 12,284,781 B2
(45) Date of Patent: Apr. 22, 2025

(54) SOUND ABSORPTION DEVICE, HEAT DISSIPATION DEVICE AND SERVER CHASSIS

(71) Applicant: Lenovo (Beijing) Limited, Beijing (CN)

(72) Inventors: Haiyan Chen, Beijing (CN); Yewei Cao, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 396 days.

(21) Appl. No.: 17/684,128

(22) Filed: Mar. 1, 2022

(65) Prior Publication Data
US 2023/0021389 A1   Jan. 26, 2023

(30) Foreign Application Priority Data

Jul. 22, 2021 (CN) .......................... 202110831593.6

(51) Int. Cl.
*H05K 7/20* (2006.01)
*F04D 29/66* (2006.01)

(52) U.S. Cl.
CPC ....... *H05K 7/20154* (2013.01); *F04D 29/664* (2013.01); *H05K 7/20145* (2013.01); *H05K 7/20172* (2013.01); *H05K 7/20736* (2013.01)

(58) Field of Classification Search
CPC .......... H05K 7/20154; H05K 7/20145; H05K 7/20172; H05K 7/20736; F04D 29/66; G11B 33/08
See application file for complete search history.

(56) References Cited

U.S. PATENT DOCUMENTS

| | | | |
|---|---|---|---|
| 6,481,527 B1 * | 11/2002 | French .................... | G10K 11/16 181/198 |
| 7,929,295 B2 * | 4/2011 | Joshi ................... | H05K 7/20772 361/679.48 |
| 8,144,465 B2 * | 3/2012 | Liang ........................ | G06F 1/20 361/679.48 |
| 8,701,821 B2 * | 4/2014 | O'Coimin .......... | H05K 7/20736 181/224 |
| 10,244,662 B2 * | 3/2019 | LaPree ..................... | F24F 13/24 |
| 10,319,414 B2 * | 6/2019 | Paterra ................. | G11B 33/022 |
| 10,468,010 B2 * | 11/2019 | Chen .................... | F16L 55/0331 |
| 10,631,432 B2 * | 4/2020 | Gopalakrishna ... | H05K 7/20181 |
| 11,246,241 B1 * | 2/2022 | Ross ..................... | F24F 1/0063 |
| 11,443,726 B2 * | 9/2022 | Wu ........................ | G06F 1/182 |

(Continued)

FOREIGN PATENT DOCUMENTS

| | | | | |
|---|---|---|---|---|
| CN | 109799884 A | | 5/2019 | |
| WO | WO-2021044272 A1 * | | 3/2021 | ........... G10K 11/168 |

*Primary Examiner* — Jeremy A Luks
(74) *Attorney, Agent, or Firm* — ANOVA LAW GROUP, PLLC

(57) ABSTRACT

The present application discloses a sound absorbing device to be placed in an airflow that is in a first direction. The sound absorbing device includes a housing; a plurality of sound absorbing units disposed in the housing to be passed by the airflow, the plurality of sound absorbing units being arranged in a direction perpendicular to the first direction, any two adjacent sound absorbing units being separated by a gap; and a plurality of supports fixed in the housing. The plurality of sound absorbing units are fixed to the housing through the plurality of supports.

18 Claims, 5 Drawing Sheets

(56) References Cited

U.S. PATENT DOCUMENTS

| | | | |
|---|---|---|---|
| 2008/0230305 A1* | 9/2008 | Goto | G06F 1/182 |
| | | | 181/224 |
| 2010/0307862 A1* | 12/2010 | Yamauchi | H02K 5/24 |
| | | | 181/224 |
| 2011/0214935 A1* | 9/2011 | Cursetjee | F24F 13/24 |
| | | | 181/231 |
| 2011/0284316 A1* | 11/2011 | O'Coimin | H05K 7/20736 |
| | | | 181/156 |
| 2018/0090181 A1* | 3/2018 | Paterra | G11B 33/1486 |
| 2023/0020411 A1* | 1/2023 | Adrian | G11B 33/08 |

* cited by examiner

SOUND ABSORPTION DEVICE, HEAT DISSIPATION DEVICE AND SERVER CHASSIS

CROSS-REFERENCES TO RELATED APPLICATION

This application claims priority to Chinese Patent Application No. 202110831593.6, filed on Jul. 22, 2021, the entire content of which is incorporated herein by reference.

FIELD OF TECHNOLOGY

The present disclosure relates to the field of noise reduction and sound absorption and, more specifically, to a sound absorption device, a heat dissipation device, and a chassis for a server.

BACKGROUND

With the development trend of electronic components integration, high density, and high power, the heat generated by the server is increasing, and the speed requirements for high-performance fans are also increasing. As a rotating machinery, the higher the speed of the fan, the greater the airflow disturbance and unbalanced response during operation, and the resulting noise will increase accordingly. Studies have shown that the noise generated by the fan can be transmitted to the mechanical hard disk through air, and the noise will lead to a decrease in the read and write performance of the mechanical hard disk. Experiments have shown that noise is the main reason for the decreased performance of hard disks in the chassis. However, the impact of noise of the performance of mechanical hard disks is difficult to reduce by adjusting the servo control system inside the mechanical hard disks. Accordingly, reducing noise transmission is the main approach to achieve server noise reduction and sound absorption.

In implementations, in order to reduce the noise in the chassis, sound absorbing cotton materials are generally added to the bottom, top, or the back of the hard disk backplane where the fan contacts the chassis, thereby achieving the effect of shock absorption and noise absorption. Generally, the effective thickness of the sound absorbing cotton needs to be 5-8 mm in order to fully serve its purpose. Due to the limitation of server space and the impact of high power consumption, large sound absorbing cottons with effective thickness cannot be added around the fan, therefore, the sound absorbing effect needs to be further improved.

BRIEF SUMMARY OF THE DISCLOSURE

One aspect of the present disclosure provides a sound absorbing device to be placed in an airflow flowing in a first direction. The sound absorbing device includes a housing; a plurality of sound absorbing units disposed in the housing to be passed by the airflow, the plurality of sound absorbing units being arranged in a direction perpendicular to the first direction, any two adjacent sound absorbing units being separated by a gap; and a plurality of supports fixed in the housing, wherein the plurality of sound absorbing units are fixed to the housing through the plurality of supports.

Another aspect of the present disclosure provides a heat dissipation device. The heat dissipation device includes a fan assembly a sound absorbing device. The sound absorbing device includes a housing; a plurality of sound absorbing units disposed in the housing to be passed by an airflow, the plurality of sound absorbing units being arranged in a direction perpendicular to a first direction, any two adjacent sound absorbing units being separated by a gap; and a plurality of supports fixed in the housing, the plurality of sound absorbing units being fixed to the housing through the plurality of supports. The sound absorbing device is disposed on an air intake side of the fan assembly.

Another aspect of the present disclosure provides a server chassis. The server chassis includes a hard disk area configured to receive a hard disk, a fan area configured to receive a fan assembly, and a sound absorbing area configured to receive a sound absorbing device. The sound absorbing device includes a housing; a plurality of sound absorbing units disposed in the housing to be passed by an airflow, the plurality of sound absorbing units being arranged in a direction perpendicular to a first direction, any two adjacent sound absorbing units being separated by a gap; and a plurality of supports fixed in the housing, the plurality of sound absorbing units being fixed to the housing through the plurality of supports. The sound absorbing area is arranged between the hard disk area and the fan area.

BRIEF DESCRIPTION OF THE DRAWINGS

To more clearly illustrate the technical solution in the present disclosure, the accompanying drawings used in the description of the disclosed embodiments are briefly described hereinafter. The drawings are not necessarily drawn to scale. Similar drawing labels in different drawings refer to similar components. Similar drawing labels with different letter suffixes refer to different examples of similar components. The drawings described below are merely some embodiments of the present disclosure. Other drawings may be derived from such drawings by a person with ordinary skill in the art without creative efforts and may be encompassed in the present disclosure.

DETAILED DESCRIPTION

Technical solutions of the present disclosure will be described in detail with reference to the drawings. It will be appreciated that the described embodiments represent some, rather than all, of the embodiments of the present disclosure. Other embodiments conceived or derived by those having ordinary skills in the art based on the described embodiments without inventive efforts should fall within the scope of the present disclosure.

Fans are provided in conventional chassis to reduce the temperature in the chassis, thereby effectively dissipating heat from heating elements such as hard disks. However, since a fan is a rotating machinery, the higher the rotational speed, the greater the airflow disturbance and unbalanced response during operation, and the resulting noise will increase accordingly. This noise is the main reason for the decreased performance of the hard disks in the chassis. In conventional technology, sound absorbing materials made of cotton are often used to achieve the effect of shock absorption and noise absorption. However, since the space in the chassis is limited, the shock absorption and noise absorption effects are also limited.

Figure 1:
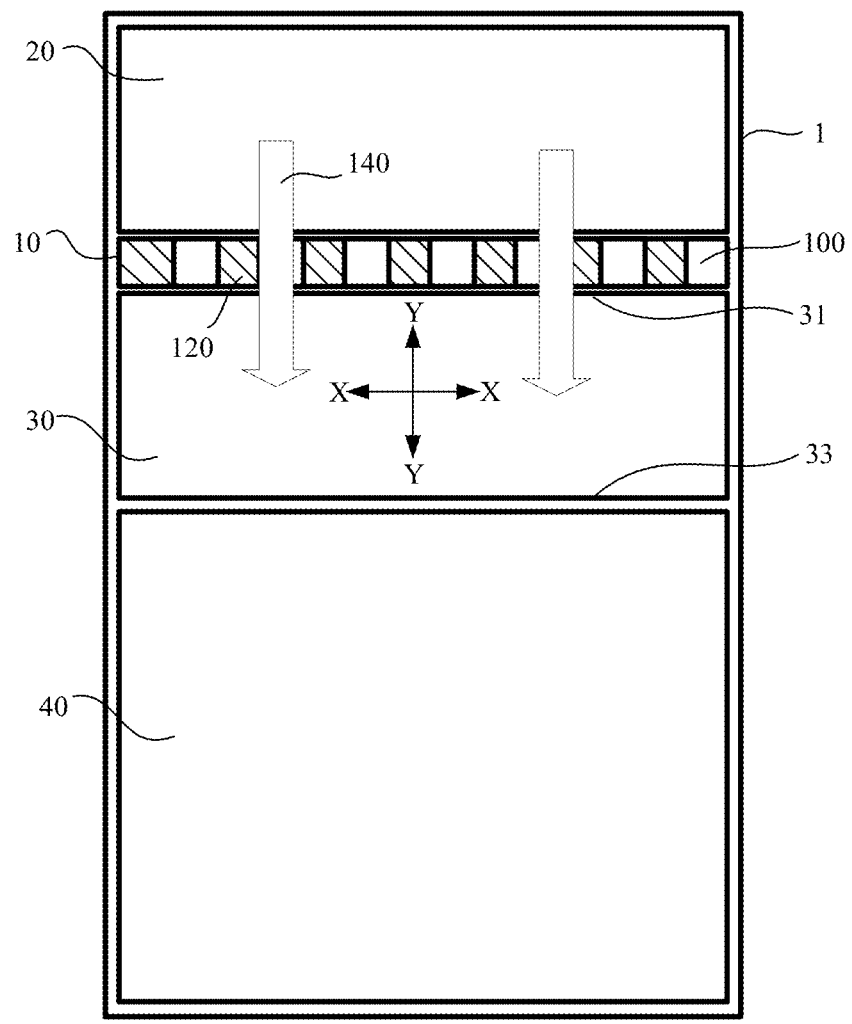
FIG. 1 is a schematic diagram of a chassis according to an embodiment of the present disclosure.

In view of the above situation, an embodiment of the present disclosure provides a sound absorption device, and the sound absorption device can be disposed in a chassis 1 for a server. FIG. 1 is a top view of the schematic structure of the chassis 1. As shown in FIG. 1, the chassis 1 includes a hard disk area 20 for receiving a hard disk, a fan area 30 for receiving a fan assembly, a sound absorbing area 10 for receiving a sound absorbing device 100, and an area 40 for receiving other electronic devices. The other electronic devices may include, a central processing unit (CPU), a multimedia module, a network module, etc., as well as other storage modules and heat dissipation modules.

As shown in FIG. 1, the sound absorbing area 10 is disposed between the hard disk area 20 and the fan area 30, and the sound absorbing area 10 is disposed on an air intake side 31 of the fan area 30. In actual operation, when the fan assembly in the fan area 30 starts to rotate, a negative pressure can be formed near the air intake side 31 of the fan area 30, and a positive pressure can be formed near an exhaust side 33 of the fan area 30, and an airflow 140 flowing in a first direction can be formed. The airflow 140 can carry the heat generated by the hard disks in the hard disk area 20 to flow toward the fan area 30 and pass through the sound absorbing area 10 and the fan area 30 in sequence.

When the airflow 140 carries the heat through the sound absorbing device 100, on one hand, the gaps between sound absorbing units 120 may reduce the wind resistance of the airflow 140, such that the heat transfer speed can be increased to improve the heat dissipation efficiency. On the other hand, the noise generated by the fan may also be absorbed by the sound absorbing units 120 at the same time. In addition, the sound absorbing units 120 arranged at intervals can also increase the contact area with the air that causes vibration caused by noise, thereby improving the noise reduction efficiency.

Figure 2:
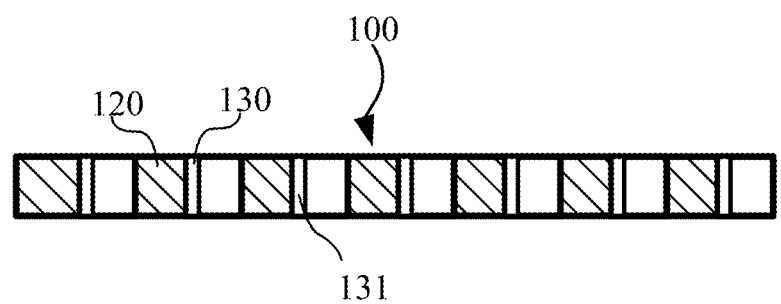
FIG. 2 is a schematic top cross-sectional view of a sound absorbing device according to an embodiment of the present disclosure.
Figure 3:
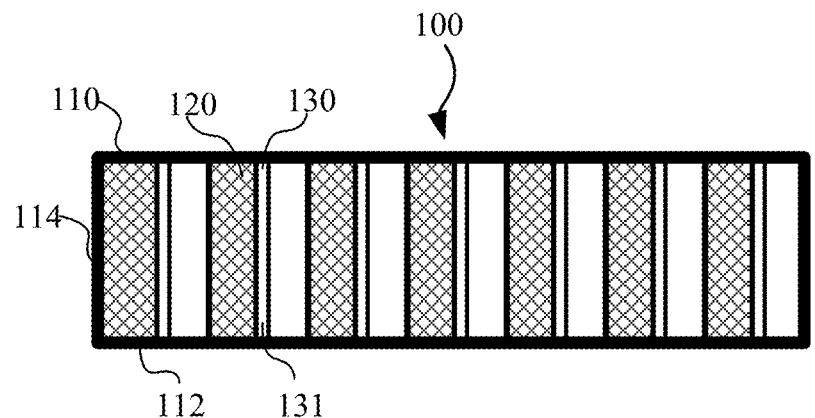
FIG. 3 is a rear view of the sound absorbing device in FIG. 2.

FIG. 2 is a schematic top cross-sectional view of the sound absorbing device 100 according to an embodiment of the present disclosure, and FIG. 3 is a rear view of the sound absorbing device 100. As shown in FIG. 2 and FIG. 3, the sound absorbing device 100 includes a housing 110, a plurality of sound absorbing units 120, and a plurality of supports 130. In this embodiment, as shown in FIG. 3, the housing 110 includes upper and lower housing outer walls 112 and left and right housing outer walls 114, and in the front-rear direction, the housing 110 is in an open structure, therefore, the housing 110 is in a frame-shaped structure as a whole. In other embodiments, the housing 110 may also include baffles in the front-rear direction, and the baffles may include grills or holes to allow the airflow 140 to pass through.

Each support 130 may include a first support piece 131. The first support piece 131 may have a sheet-like structure and may be fixed between the upper housing outer wall 112 and the lower housing outer wall 112. In this embodiment, each sound absorbing unit 120 is attached and fixed on a first support piece 131. For example, the sound absorbing unit 120 may be attached and fixed to the side surface of the first support piece 131 by means of adhesive. It should be understood that, the side surface of the sound absorbing unit 120 may be attached to each other with the first support piece 131 in a partial area.

Figure 4:
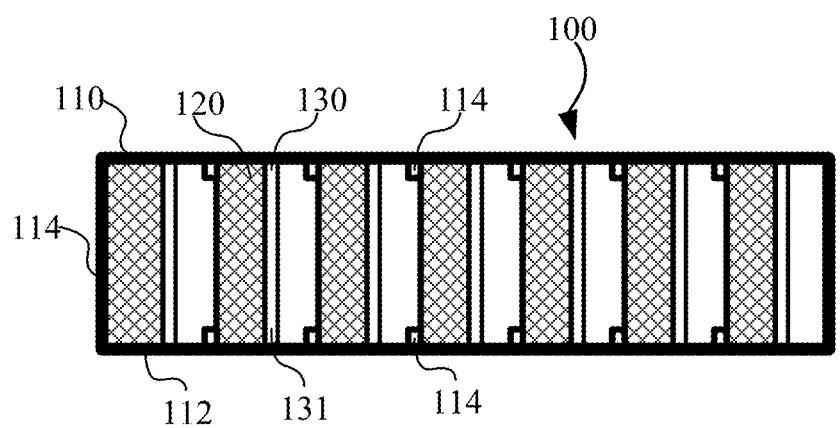
FIG. 4 is a rear view of the sound absorbing device according to another embodiment of the present disclosure.

FIG. 4 is a rear view of the sound absorbing device 100 according to an embodiment of the present disclosure, where the housing 110 includes a plurality of protrusions 114 on the inner sides of the upper housing outer wall 112 and the lower housing outer wall 112. In this embodiment, each sound absorbing unit 120 may be shaped and fixed between the protrusion 114 and the corresponding first support piece 131. In this embodiment, the adhesive connection between the sound absorbing unit 120 and the first support piece 131 may be omitted.

The first support piece 131 may be integrally formed with the upper and housing outer walls 112, or the first support piece 131 may be fixedly connected to the upper and housing outer walls 112 by means such as screw connection, rivet connection, or welding.

In this embodiment, the first support piece 131 may have a grid structure, a mesh structure, or a porous structure. The first support piece 131 will not block the airflow 140 from entering the sound absorbing unit 120 from the side thereof, and can also absorb noise to a certain extent.

The material of the sound absorbing unit 120 may be a porous material such as asbestos or glass wool felt. Due to a large number of tiny pores, such as sound absorbing unit 120 can absorb noise.

In the foregoing embodiment, by disposing the sound absorbing device 100 between the fan area 30 and the hard disk area 20, on one hand, when the airflow 140 carrying heat passes through the sound absorbing device 100, due to the gaps between the sound absorbing units 120 arranged at intervals, the wind resistance of the airflow 140 can be significantly reduce, thereby improving the heat dissipation efficiency. On the other hand, the material of the sound absorbing units 120 can be a porous material, which can absorb the noise generated by the fan. At the same time, by arranging the sound absorbing units 120 at intervals, the contact area between the sound absorbing units 120 and the noise can also be increased, thereby further improving the noise reduction effect.

Figure 5:
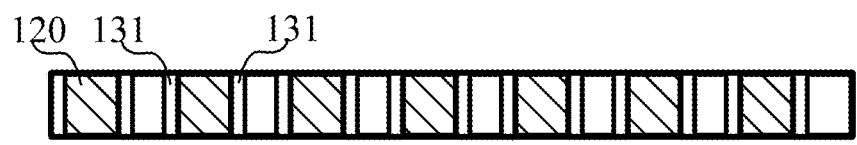
FIG. 5 is a schematic top cross-sectional view of the sound absorbing device according to an embodiment of the present disclosure.

FIG. 5 is a schematic top cross-sectional view of the sound absorbing device 100 according to an embodiment of the present disclosure. As shown in FIG. 5, in this embodiment, each support 130 includes two first support pieces 131. The first support pieces 131 are all arranged in parallel with the first direction, and are fixed between the upper and lower housing outer walls 112. Each sound absorbing unit 120 can be inserted between the two first support pieces 131 to be fixed in the housing 110. In this embodiment, the sound absorbing units 120 may also be additionally attached to one or two support pieces 131, such that the sound absorbing units 120 can be more firmly fixed in the housing 110.

Figure 6:
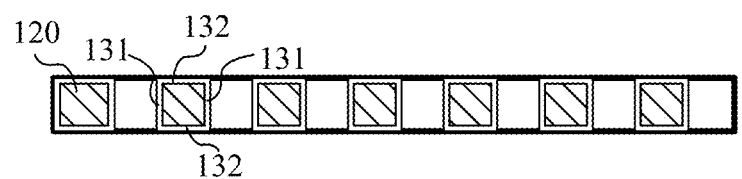
FIG. 6 is a schematic top cross-sectional view of the sound absorbing device according to an embodiment of the present disclosure.

FIG. 6 is a schematic top cross-sectional view of the sound absorbing device 100 according to an embodiment of the present disclosure. As shown in FIG. 6, in this embodiment, each support 130 includes two first support pieces 131, and further includes two second support pieces 132. In this embodiment, the first support pieces 131 can be arranged parallel to the first direction of the airflow 140, and the second support pieces 132 can be arranged perpendicular to the first direction of the airflow 140. Therefore, the two first support pieces 131 and the two second support pieces 132 can form a frame-shaped structure. In this embodiment, the sound absorbing units 120 can be filled within the frame-shaped structure.

Figure 7:
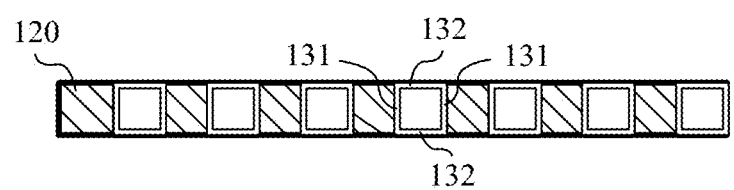
FIG. 7 is a schematic top cross-sectional view of the sound absorbing device according to an embodiment of the present disclosure.

FIG. 7 is a schematic top cross-sectional view of the sound absorbing device according to an embodiment of the present disclosure. As shown in FIG. 7, in this embodiment, each support 130 also includes two first support pieces 131 arranged parallel to the first direction of the airflow 140 and two second support pieces 132 arranged perpendicular to the first direction of the airflow 140. The two first support pieces 131 and the two second support pieces 132 can also form a frame-shaped structure. However, in this embodiment, the sound absorbing units 120 may be disposed outside the frame-shaped structure of each support 130. More specifically, the sound absorbing units 120 may be inserted between the first support pieces 131 of two adjacent supports 130, or between the first support pieces 131 of an end support 130 and the side housing outer wall 114 of the end.

Figure 8:
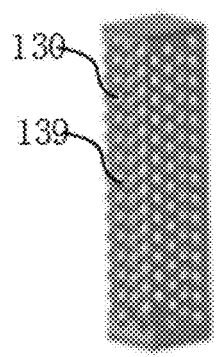
FIG. 8 is a schematic structural diagram of a support in FIG. 6 and FIG. 7.

FIG. 8 is a schematic structural diagram of the frame-shaped support 130 in FIG. 6 and FIG. 7. The two first support pieces 131 and the two second support pieces 132 of the frame-shaped structure include a plurality of holes 139 to allow airflow to pass through the support pieces and enter the nearby sound absorbing units 120. In other embodiments, the support pieces may also have a grid structure or a mech structure.

Figure 9:
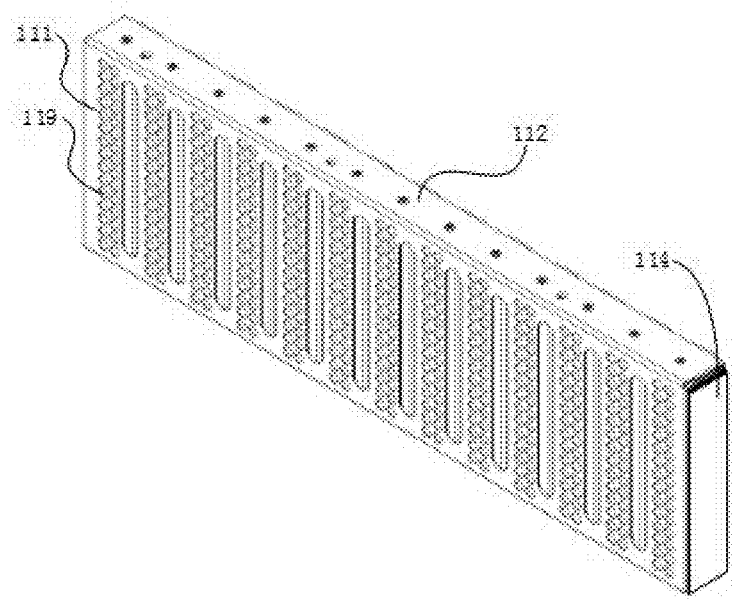
FIG. 9 is a perspective view of the sound absorbing device according to an embodiment of the present disclosure.

FIG. 9 is a perspective view of the sound absorbing device 100 according to an embodiment of the present disclosure. The sound absorbing device 100 is similar to the embodiment shown in FIG. 7. As shown in FIG. 9, the housing 110 includes upper and lower housing outer walls 112 and left and right housing outer walls 114. In addition, the housing 110 further includes a baffle 111. The baffle 111 may be perpendicular to the first direction of the airflow 140 when placed in the server chassis. In this embodiment, the baffle 111 includes a plurality of holes 119 to allow airflow to pass through the baffle 111. In other embodiments, the baffle 111 may also have a grid structure or a mesh structure. When the airflow 140 passes through the baffle 111, the grid structure, mesh structure, or porous structure on the baffle 111 may rectify and filter the airflow 140. In addition, the baffle 111 may also prevent the airflow 140 from blowing directly onto the sound absorbing units 120, thereby improving the service life of the sound absorbing units 120. It should be understood that in the first direction in which the airflow 140 flows, the housing 110 may include a front baffle 111 on the upstream side, a rear baffle 111 on the downstream side, or both the front baffle 111 and the rear baffle 111.

Figure 10:
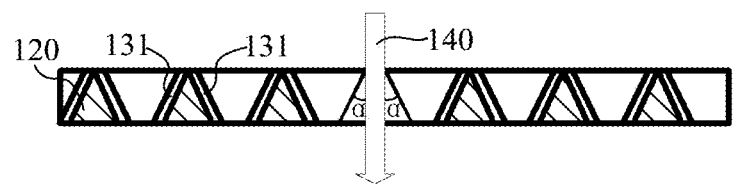
FIG. 10 is a schematic top cross-sectional view of the sound absorbing device according to an embodiment of the present disclosure.

FIG. 10 is a schematic top cross-sectional view of the sound absorbing device 100 according to an embodiment of the present disclosure. As shown in FIG. 10, in this embodiment, the cross-sectional area of the sound absorbing unit 120 gradually increases along the first direction of the airflow 140. In particular, the cross section of the sound absorbing unit 120 is a triangle. Correspondingly, each support 130 includes two first support pieces 131, and an included angle α between each first support piece 131 and the first direction may be an acute angle. The surface of the first support piece 131 may be in contact with the side surface of the sound absorbing unit 120. In some embodiments, the sound absorbing unit 120 may be attached to the surface of the first support piece 131. When the airflow 140 passes through the sound absorbing unit 120, the sound absorbing unit 120 having a triangular cross section can significantly reduce the wind resistance. At the same time, since the first support piece 131 forms an acute angle with the first direction to form an inclined plane, the contact area between the sound absorbing unit 120 and the noise in the air can be further increased.

In the embodiment shown in FIG. 10, the housing 110 may include at least a rear baffle 111. The two first support pieces 131 and the rear baffle 111 may form a triangular prism space with a triangular cross section, and the sound absorbing units 120 may be filled in the triangular prism space.

Figure 11:
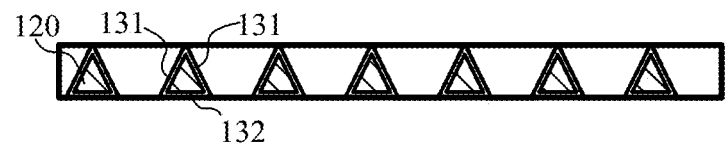
FIG. 11 is a schematic top cross-sectional view of the sound absorbing device according to an embodiment of the present disclosure.

FIG. 11 is a schematic top cross-sectional view of the sound absorbing device 100 according to an embodiment of the present disclosure. As shown in FIG. 11, in this embodiment, the support 130 further includes a second support piece 132. The second support piece 132 and the two first support pieces 131 described above may form a frame-shaped structure substantially in the shape of a triangular prism, and the frame-shaped structure may be clamped between the upper and lower housing outer walls 112. The sound absorbing unit 120 may be disposed in the triangular prism structure.

In the embodiment shown in FIG. 11, the protection and support of the sound absorbing unit 120 can be strengthened by the frame-shaped structure enclosed by the first support pieces 131 and the second support piece 132. Further, the first support pieces 131 and the second support piece 132 may both have a grid structure, a mesh structure, or a porous structure, which improves the noise absorption efficiency of the sound absorbing units 120.

Figure 12:
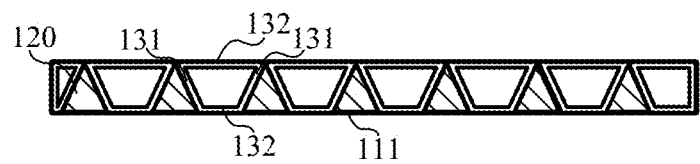
FIG. 12 is a schematic top cross-sectional view of the sound absorbing device according to an embodiment of the present disclosure.

FIG. 12 is a schematic top cross-sectional view of the sound absorbing device according to an embodiment of the present disclosure. As shown in FIG. 12, in this embodiment, each support 130 includes two first support pieces 131 and two second support pieces 132, and the housing 110 includes at least one rear baffle 111. The second support pieces 132 and the first support pieces 131 of each support 130 may form a frame-shaped structure, and the cross-section of the frame-shaped structure may be trapezoidal. The two adjacent second support pieces 132 of every two frame-shaped structures and the rear baffle 111 may form a space with a triangular cross-section, and the sound absorbing units 120 may be disposed in the space. It should be understood that in other embodiments, the distance between two adjacent supports 130 may be set relatively large, and the housing 110 may further include a front baffle 111. In this way, the two adjacent second support pieces 132 of the two adjacent frame-shaped structures and the front and rear baffles 111 may form a space with a trapezoidal cross-section, and the sound absorbing unit 120 may be disposed in the space. In this embodiment, the cross-sectional area of the sound absorbing unit 120 in the first direction may be gradually increased, thereby increasing the contact area between the sound absorbing unit 120 and the noise in the air.

Figure 13:
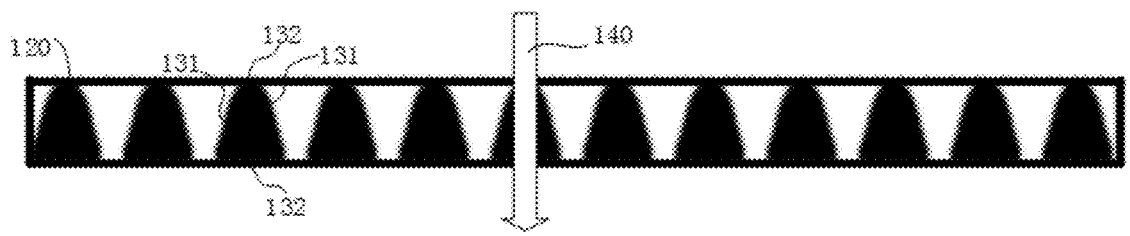
FIG. 13 is a schematic top cross-sectional view of the sound absorbing device according to an embodiment of the present disclosure.
Figure 14:
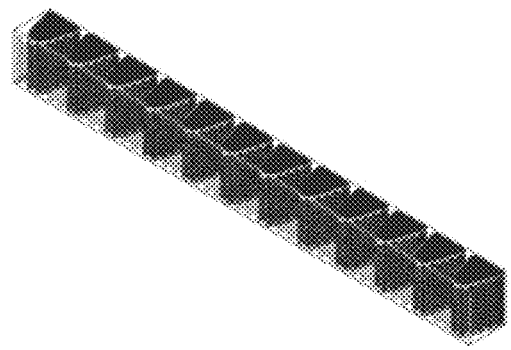
FIG. 14 is a perspective view of the sound absorbing device in FIG. 13.
Figure 15:
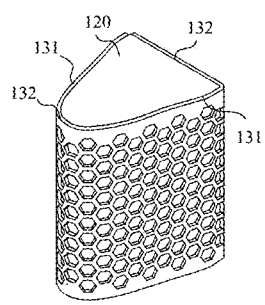
FIG. 15 is a perspective view of a sound absorbing unit and a support in FIG. 13.

FIG. 13 is a schematic top cross-sectional view of the sound absorbing device 100 according to an embodiment of the present disclosure, FIG. 14 is a perspective view of the sound absorbing device 100, and FIG. 15 is a perspective view of a sound absorbing unit 120 and a support 130. As shown in FIG. 13, in this embodiment, each support 130 includes two first support pieces 131 and two second support pieces 132. The two second support pieces 132 and the two first support piece 131 form a frame-shaped structure, and the sound absorbing units 120 can be filled in the frame-shaped structure. On one hand, the second support piece 132 facing the first direction may be arc-shaped, and the arc-shaped second support piece 132 may reduce the wind resistance of the airflow 140 and increase the efficiency of heat dissipation. On the other hand, on the basis of the first support piece 131 forming an acute angle with the first direction, the contact area between the noise and the sound absorbing unit 120 may be further increased, thereby improving the noise reduction efficiency of the sound absorbing unit 120.

In some embodiments, compared with the chassis in conventional technology, the chassis with the sound absorbing device 100 provided in the embodiments of the present disclosure can further reduce the noise by 20%, and in terms of impact of noise on the read and write performance of the hard disk, the chassis provided in the present disclosure is 10%-20% lower than the conventional technology. At the same time, the sound absorbing unit 120 provided in the present disclosure may adopt a relatively inexpensive porous material such as asbestos or glass wool felt. The sound absorbing device 100 can improve the noise reduction efficiency of the sound absorbing material, and can achieve an effective noise reduction effect with reduced costs.

In another embodiment of the present disclosure, the rear side of the sound absorbing device 100 may further include a fan assembly. In other words, the sound absorbing device 100 may be disposed on the air intake side of the fan assembly. The heat dissipation device provided in this embodiment may also be applicable to the chassis, and the heat dissipation device can also improve the heat dissipation efficiency while reducing noise.

It should be noted that the foregoing embodiments are merely intended for describing the technical solutions of the present disclosure instead of limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A sound absorbing device to be placed in an airflow in a first direction, comprising:
a housing;
a plurality of sound absorbing units disposed in the housing to be passed by the airflow, the plurality of sound absorbing units being arranged in a direction perpendicular to the first direction, any two adjacent sound absorbing units being separated by a gap; and
a plurality of supports fixed in the housing, wherein the plurality of sound absorbing units are fixed to the housing through the plurality of supports;
wherein each of the plurality of supports includes two or more first support pieces and two or more second support pieces, and a first one of the two or more second support pieces facing the first direction has an arc shape, a second one of the two or more second support pieces forms a flat surface perpendicular to the first direction, and the two or more first support pieces each forms an acute angle with the flat surface formed by the second one of the two or more second support pieces.

2. The sound absorbing device of claim 1, wherein:
a cross-sectional area of each of the plurality of sound absorbing units gradually increases in the first direction.

3. The sound absorbing device of claim 1, wherein:
at least one of the two or more first support pieces is attached to a surface of a corresponding sound absorbing unit and is parallel to the first direction or has an acute angle with the first direction.

4. The sound absorbing device of claim 1, wherein:
each of the two or more first support pieces has one or more of a grid structure, a mesh structure, or a porous structure.

5. The sound absorbing device of claim 3, wherein:
the two or more first support pieces and the two or more second support pieces connecting to form a frame-shaped structure.

6. The sound absorbing device of claim 1, wherein:
a corresponding sound absorbing unit is filled in the frame-shaped structure.

7. The sound absorbing device of claim 1, wherein:
the housing includes a baffle having one or more of a grid structure, a mesh structure, or a porous structure, the baffle being arranged perpendicular to the first direction.

8. A heat dissipation device comprising:
a fan assembly; and
a sound absorbing device, the sound absorbing device including:
a housing;
a plurality of sound absorbing units disposed in the housing to be passed by an airflow, the plurality of sound absorbing units being arranged in a direction perpendicular to a first direction, any two adjacent sound absorbing units being separated by a gap; and
a plurality of supports fixed in the housing, the plurality of sound absorbing units being fixed to the housing through the plurality of supports, wherein
the sound absorbing device is disposed on an air intake side of the fan assembly;
wherein each of the plurality of supports includes two or more first support pieces and two or more second support pieces, and a first one of the two or more second support pieces facing the first direction has an arc shape, a second one of the two or more second support pieces forms a flat surface perpendicular to the first direction, and the two or more first support pieces each forms an acute angle with the flat surface formed by the second of the two or more second support pieces.

9. The heat dissipation device of claim 8, wherein:
a cross-sectional area of each of the plurality of sound absorbing units gradually increases in the first direction.

10. The heat dissipation device of claim 8, wherein:
at least one of the two or more first support pieces is attached to a surface of a corresponding sound absorbing unit and is parallel to the first direction or has an acute angle with the first direction.

11. The heat dissipation device of claim 8, wherein:
each of the two or more first support pieces has one or more of a grid structure, a mesh structure, or a porous structure.

12. The sound absorbing device of claim 8, wherein:
the two or more first support pieces and the two or more second support pieces connecting to form a frame-shaped structure.

13. The heat dissipation device of claim 8, wherein:
a corresponding sound absorbing unit is filled in the frame-shaped structure.

14. The heat dissipation device of claim 8, wherein:
the housing includes a baffle having a grid structure, a mesh structure, or a porous structure, the baffle being arranged perpendicular to the first direction.

15. A server chassis comprising:
a hard disk area configured to receive a hard disk;
a fan area configured to receive a fan assembly; and
a sound absorbing area configured to receive a sound absorbing device, the sound absorbing device including:
  a housing;
  a plurality of sound absorbing units disposed in the housing to be passed by an airflow, the plurality of sound absorbing units being arranged in a direction perpendicular to a first direction, any two adjacent sound absorbing units being separated by a gap; and
  a plurality of supports fixed in the housing, the plurality of sound absorbing units being fixed to the housing through the plurality of supports, wherein
the sound absorbing area is arranged between the hard disk area and the fan area;
wherein each of the plurality of supports includes two or more first support pieces and two or more second support pieces, and a first one of the two or more second support pieces facing the first direction has an arc shape, a second one of the two or more second support pieces forms a flat surface perpendicular to the first direction, and the two or more first support pieces each forms an acute angle with the flat surface formed by the second of the two or more second support pieces.

16. The server chassis of claim 15, wherein:
a cross-sectional area of each of the plurality of sound absorbing units gradually increases in the first direction.

17. The server chassis of claim 15, wherein:
at least one of the two or more first support pieces is attached to a surface of a corresponding sound absorbing unit and is parallel to the first direction or has an acute angle with the first direction.

18. The server chassis of claim 15, wherein:
each of the two or more first support pieces has one or more of a grid structure, a mesh structure, or a porous structure.

* * * * *